United States Patent
Glodde et al.

(10) Patent No.: US 9,337,033 B1
(45) Date of Patent: *May 10, 2016

(54) DIELECTRIC TONE INVERSION MATERIALS

(71) Applicant: International Business Machines Corporation, Armonk, NY (US)

(72) Inventors: Martin Glodde, Pine Brook, NJ (US); Wu-Song Huang, Brewster, NY (US); Hiroyuki Miyazoe, White Plains, NY (US); Ratnam Sooriyakumaran, San Jose, CA (US); Hsinyu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/945,456

(22) Filed: Nov. 19, 2015

Related U.S. Application Data

(63) Continuation of application No. 14/517,093, filed on Oct. 17, 2014.

(51) Int. Cl.
*H01L 21/033* (2006.01)
*H01L 21/311* (2006.01)
*H01L 21/02* (2006.01)
(Continued)

(52) U.S. Cl.
CPC ...... *H01L 21/0332* (2013.01); *H01L 21/02153* (2013.01); *H01L 21/02282* (2013.01); *H01L 21/0337* (2013.01); *H01L 21/31116* (2013.01); *H01L 21/31138* (2013.01);
(Continued)

(58) Field of Classification Search
CPC ......... G03F 7/0752; G03F 7/11; G03F 7/094; G03F 1/80; G03F 7/0045; G03F 7/0755; G03F 7/0757; G03F 7/40; G03F 7/075; C08L 83/08; H01L 21/31144; H01L 21/0332; H01L 21/31116; H01L 21/3065; H01L 21/3086; H01L 21/31138; H01L 21/0271; H01L 21/67063; H01L 21/67069; H01L 21/308; H01L 21/32136; H01L 21/02252; H01L 21/32139; H01L 21/76819; H01L 21/02282; H01L 21/76808; C09D 183/08; C23C 18/06

USPC .................................. 430/318; 438/780, 682
See application file for complete search history.

(56) References Cited

U.S. PATENT DOCUMENTS 5,605,781 A 2/1997 Gelorme et al.
5,725,788 A 3/1998 Maracas et al.
(Continued)

OTHER PUBLICATIONS

U.S. Appl. No. 14/517,093.*
(Continued)

*Primary Examiner* — Caleen Sullivan
(74) *Attorney, Agent, or Firm* — Fusheng Xu

(57) ABSTRACT

A process for patterning a hard mask material with line-space patterns below a 30 nm pitch and a 15 nm critical dimension by employing a spin-on titanium-silicon (TiSi) polymer or oligomer as a tone inversion material is provided. The spin-on TiSi material is spin-coated over a patterned OPL that includes a first pattern generated from a DSA based process. The spin-on TiSi material fill trenches within the patterned OPL to form a tone inverted pattern by removing the patterned OPL selective to the spin-on TiSi material. The inverted pattern is a complementary pattern to the first pattern, and is transferred into the underlying hard mask material by an anisotropic etch.

15 Claims, 2 Drawing Sheets

(51) Int. Cl.
*G03F 7/09* (2006.01)
*G03F 7/075* (2006.01)

(52) U.S. Cl.
CPC ....... *H01L 21/31144* (2013.01); *G03F 7/0752* (2013.01); *G03F 7/0757* (2013.01); *G03F 7/094* (2013.01)

(56) References Cited

U.S. PATENT DOCUMENTS

| | | |
|---|---|---|
| 6,045,968 A | 4/2000 | Ushirogouchi et al. |
| 7,326,442 B2 | 2/2008 | Babich et al. |
| 7,390,609 B2 | 6/2008 | Zampini et al. |
| 8,026,037 B2 | 9/2011 | Zampini et al. |
| 8,450,212 B2 | 5/2013 | Angyal et al. |
| 8,771,929 B2 | 7/2014 | Guillorn et al. |
| 2007/0037410 A1 | 2/2007 | Chang et al. |

OTHER PUBLICATIONS

IBM Appendix P, list of patents and patent applications treated as related, Nov. 19, 2015, 2 pages.

Lenza et al., "Synthesis of Titania-Silica Materials by Sol-Gel", Materials Research, vol. 5, No. 4, Revised: Sep. 23, 2002, pp. 497-502, © 2002.

Glodde et al., "Dielectric Tone Inversion Materials", U.S. Appl. No. 14/517,093, filed Oct. 17, 2014, pp. 1-32.

* cited by examiner

DSA pattern in OPL

DIELECTRIC TONE INVERSION MATERIALS

STATEMENT REGARDING FEDERALLY SPONSORED RESEARCH OR DEVELOPMENT

This invention was made with United States Government support under Contract No. FA8650-10-C-7038 entered with the following United States Governmental Agency: Defense Advanced Research Projects Agency (DARPA). The United States government has certain rights to this invention.

FIELD OF THE INVENTION

The present invention relates generally to the field of semiconductor manufacturing, and more particularly to a method for patterning a hard mask material.

BACKGROUND OF THE INVENTION

As integrated circuit densities have scaled, the use of grating based patterning techniques and unidirectional design has become an integral part of pattern formation technology. Grating fabrication can be accomplished using a variety of techniques including directed self-assembly (DSA), sidewall image transfer, pitch split lithography, extreme ultraviolet lithography (EUV), electron beam lithography (EBL), and interference lithography.

The grating pattern is customized to form a circuit pattern. The ability to register customizing shapes to the grating pattern imposes a limitation on the spatial frequency (pitch) of the grating structure.

DSA is a technique for forming a sublithographic line/space pattern utilizing the phase separation of a block copolymer thin film. The composition of the copolymer controls both the resolution and the critical dimension (line width) of the pattern. A templating process controls both the orientation and ordering of the pattern. The templating process involves chemical epitaxy and/or graphoepitaxy. The advantages of DSA include a high resolution of features at dimensions less than 10 nm, compatibility with existing lithography techniques, and the ability for frequency multiplication and space subdivision.

A patterning technique of self-aligned patterning based on DSA graphoepitaxy using a tone inversion material, herein referred to as a tone inverted grapho-epitaxy method, is recently developed, in which a SiARC-like (Si anti-reflective coating) material is applied as the tone inversion material. An example of an SiARC-like material is JSR Corporation's JSR IRM-007. (Note: the term(s) "JSR" and/or "JSR-IRM" may be subject to trademark rights in various jurisdictions throughout the world and are used here only in reference to the products or services properly denominated by the marks to the extent that such trademark rights may exist.)

SUMMARY

According to an aspect of the present invention, there is a process for patterning a hard mask material with line-space patterns below a 30 nm pitch and a 15 nm critical dimension by employing a spin-on titanium-silicon (TiSi) material as a tone inversion material, that includes the following steps: (i) patterning an organic planarization (OPL) layer over a hard mask material with a line-space pattern below the 30 nm pitch and the 15 nm critical dimension; (ii) formulating, filling, and overcoating the spin-on TiSi material into a patterned OPL layer; (iii) etching back an excessive spin-on TiSi material, the excessive spin-on TiSi material overcoating the patterned OPL layer; (iv) extracting the patterned OPL layer to achieve an inverted pattern; and (v) etching the inverted pattern into the hard mask material.

DETAILED DESCRIPTION

Figure 1A:
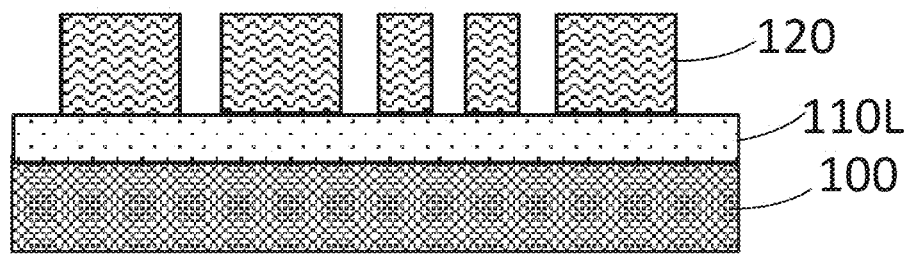
FIGS. 1A and 1B illustrate an exemplary first step for patterning a hard mask material with line-space patterns below 30 nm pitch and 15 nm critical dimensions by the use of the spin-on TiSi material as atone inversion material, according to an embodiment of the present disclosure: patterning an organic planarization layer (OPL) over a hard mask material with line-space patterns below 30 nm pitch and 15 nm critical dimension.

Conventionally, the tone inversion material used for tone inverted grapho-epitaxy method is a SiARC-like material, which has marginal etch contrast to dielectric or silicon reactive ion etch processes. Aggressive annealing of the tone inversion material and careful development of the etch recipes is required to yield the etch transfer of such SiARC-like material.

In the tone-inverted graphoepitaxy method, the quality of a tone inversion process directly impacts the quality of the end patterns. Desirable qualities of a tone inversion material include: (i) filling small gaps well (in the context of tone inverted graphoepitaxy, the ability to fill 10 nm-wide trenches with at least 30 nm height at a 28 nm pitch is required); (ii) reasonable planarization (planarization of the above substrate to within 5 nm thickness is required for an etch back process to reveal all patterns at the same time given that the substrate has a uniform pattern density across the whole wafer); and/or (iii) good etch resistance to subsequent etch transfer steps.

Some embodiments of the present invention provide a titanium-silicon hybrid polymer or a titanium-silicon hybrid oligomer as a tone inversion material. These tone inversion materials are collectively referred to herein as a spin-on TiSi material. Further, a process is presented for patterning a hard mask material (e.g., silicon oxide or silicon nitride) with line-space patterns below a 30 nm pitch and a 15 nm critical dimension (line width) by employing the spin-on TiSi material as a tone inversion material.

The spin-on TiSi material disclosed in the present invention is a polymer or an oligomer comprising a silicon-containing recurring unit A, and a titanium-containing recurring unit B, as shown below:

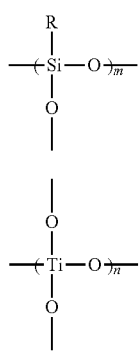

where: R is an aliphatic or an aromatic substituent; m and n are numbers of repeat units such that the ratio of m to n is near 50:50 in a range from about 40:60 to about 60:40; the molecular weight (Mn) is in a range from about 500 to about 1500; and the polydispersity is less than about 1.5. Some specific examples of R are listed below:

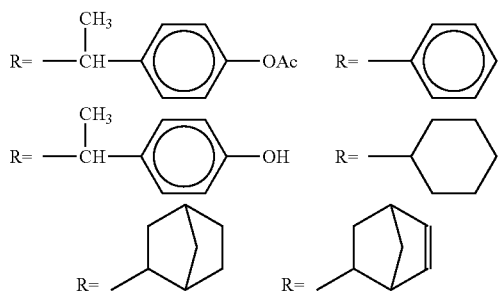

The spin-on TiSi material is soluble in casting solvents that have a flash point greater than 35° C. (e.g., close cup). The solvents include, but are not limited to, cyclohexanone and propylene glycol monomethyl ether acetate. The spin-on TiSi material can achieve similar filling and planarization capability to the conventionally used SiARC-like material. Further, the spin-on TiSi material exhibits nearly twice the etch selectivity than conventional SiARC-like material. Direct etch transfer of the tone inverted pattern with better etch resistance can be achieved with the spin-on TiSi material. No additional annealing processes are required for the spin-on TiSi material for etch transfer. Further, with the spin-on TiSi material as a tone inversion material, the etch budget and the process window can be greatly improved over conventional processes.

Reference will now be made in detail to some embodiments of the present invention, examples of which are illustrated in the accompanying figures. Wherever possible, the same reference numbers will be used throughout the figures to refer to the same or like parts.

Figure 1B:
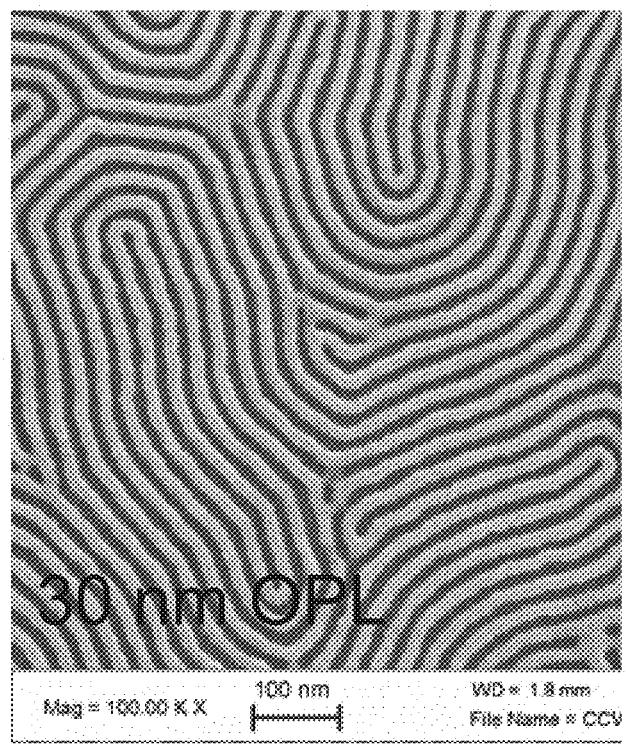

Referring to FIGS. 1A and 1B, illustrated is an exemplary first step for patterning a hard mask material with line-space patterns below 30 nm pitch and 15 nm critical dimensions by the use of the spin-on TiSi material as tone inversion material, according to some embodiments of the present invention. In this step, patterning an organic planarization layer (OPL) over a hard mask material is performed with line-space patterns below a 30 nm pitch and the 15 nm critical dimension. A patterned structure includes a stack, from bottom to top, of an auxiliary substrate 100, a hard mask material layer 110L, and a patterned organic planarization layer (OPL) 120.

The auxiliary substrate 100 can be a semiconductor substrate, a dielectric substrate, a conductive material substrate, or a combination thereof. In one embodiment, the auxiliary substrate 100 can include a bulk semiconductor substrate or a semiconductor-on-insulator (SOI) substrate, or otherwise as known, or to be known, in the art. The auxiliary substrate 100 can optionally include a metal interconnect structure including at least one dielectric material layer and metal lines and/or metal via structures embedded therein. The top surface of the auxiliary substrate 100 can be planar, or can have a non-planar topography.

The hard mask material layer 110L can be a permanent material layer that is intended to remain at the end of a sequence of processing steps, or a temporary material layer that is intended to be removed after the sequence of processing steps. In one embodiment, the hard mask material layer 110L can be a conductive material layer, a dielectric material layer, a semiconductor material layer, or a stack thereof. In some embodiments of the present invention, the hard mask material layer 110L is a dielectric hard mask layer, such as a silicon nitride layer, a silicon oxide layer, a silicon oxynitride layer, or combinations thereof. The thickness of the hard mask material layer can be from 5 nm to 100 nm, although lesser and greater thicknesses can also be employed. The top surface of the hard mask material layer 110L can either have a planar, or a non-planar topography. The hard mask material layer 110L is formed on top of the auxiliary substrate 100, and can be formed, for example, by chemical vapor deposition (CVD), atomic layer deposition (ALD), or spin-coating.

The patterned OPL 120 includes a self-planarizing material. As used herein, a self-planarizing material is a material that flows at the standard ambient temperature and pressure (SATP), i.e., 20° C. (293.15 K, 68° F.) and an absolute pressure of 101.325 kPa (14.696 psi, 1 atm), to provide a planar top surface. In one embodiment, the self-planarizing material of the OPL 120 can be an organic material including C, O, and H, and optionally including Si and/or F. The formulation of the OPL 120 can be selected to provide sufficiently low viscosity so that a top surface of the OPL is self-planarizing over underlying topographic features. In some embodiments of the present invention, the self-planarizing material of the OPL 120 is an amorphous carbon layer. The thickness of the OPL 120 can be from 10 nm to 300 nm, although lesser and greater thicknesses can also be employed.

The patterned OPL 120 includes at least one trench therein. Each trench in the patterned OPL 120 is contiguously surrounded along a periphery by a set of vertical sidewalls. The set of vertical sidewalls laterally encloses the trench. A top surface of the hard mask material layer 110L can be physically exposed at the bottom of each of the at least one trench.

The patterned OPL 120 can be formed by a DSA graphoepitaxy or a DSA chemical epitaxy. In some embodiments of the present invention, the pattern of the OPL 120 is, for example, a fingerprint pattern, as depicted in FIG. 1B. The fingerprint pattern generated from, for example, a polystyrene-block-polymethylmethacrylate (PS-b-PMMA) diblock copolymer, is etched into a 30 nm-thick OPL layer with oxygen based plasma. Examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and/or polyisoprene-block-polymethylmethacrylate (PI-b-PMMA).

Figure 2:
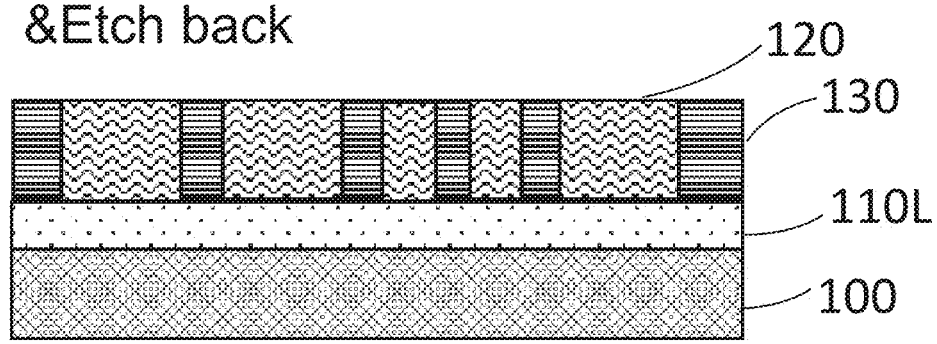
FIG. 2 illustrates an exemplary second step for patterning a hard mask material with line-space patterns below 30 nm pitch and 15 nm critical dimensions by the use of the spin-on TiSi material as a tone inversion material, according to an embodiment of the present disclosure: formulating the spin-on TiSi material into the patterned OPL layer.

Referring to FIG. 2, illustrated is an exemplary second step for patterning a hard mask material with line-space patterns below a 30 nm pitch and the 15 nm critical dimension by the use of the spin-on TiSi material as tone inversion material according to an embodiment of the present disclosure. In this step, formulating, filling, and overcoating the spin-on TiSi material into the patterned OPL layer is performed.

In some embodiments of the present invention, formulating the spin-on TiSi material is performed with the following steps: (i) mixing organic trichlorosilane (RSiCl$_3$) and Titanium (IV) chloride tetrahydrofuran complex (TiCl$_4$.2THF) in THF; (ii) adding the mixture by drop wise into a cold solution of deionized water and diethylamine mixture; (iii) stirring for about three hours; (iv) separating and heating the organic phase to reflux for about 18 hours; (v) after cooling to room temperature, washing with 100 ml saturated NaCl solution and drying over anhydrous magnesium sulfate; (vi) filtering the solution and concentrating in a rotary evaporator and then drying under high vacuum; and (vii) dissolving the dried TiSi solid material into an organic solvent, such as cyclohexanone (CH) and propylene glycol monomethyl ether acetate (PGME), with a concentration of the TiSi solid material ranging, for example, from about 1.7% to about 3.7% (the concentration of the TiSi solid material to the total weight ratio), herein referred to as a spin-on TiSi solution.

The spin-on TiSi solution is applied by spin-coating into the trenches of the patterned OPL 120 to form spin-on TiSi material portions 130, as schematically shown in FIG. 2. Thus, each spin-on TiSi material portion 130 is formed by filling a trench within the patterned OPL 120 with the spin-on TiSi solution. The spin-on TiSi solution can be applied to a height that does not exceed the topmost surface of the patterned OPL 120. In this embodiment, the height of the top surface of the spin-on TiSi material portions 130 is coplanar with the top surface of the patterned OPL 120. Alternatively, the height of the top surface of the spin-on TiSi material portions 130 is located at a horizontal plane that is above the top surface of the patterned OPL 120 to overcoat the top surface of the patterned OPL 120.

Some embodiments of the present invention accomplish a filling/overcoating process on the spin-on TiSi solution into a patterned OPL 120 by performing a spin-coating process, where the patterned OPL has a 30 nm tall amorphous carbon fingerprint pattern from a PS-PMMA block co-polymer (BCP) at a 30 nm pitch and a 10 nm gap. The spin-on TiSi solution has a concentration of 1.7% of TiSi solid material in CH solvent, and is spin-coated at 2500 rpm (revolutions per minute). In this embodiment, a two-step post-apply bake is used for curing the TiSi solution: a first bake at an elevated temperature of about 150 degrees Celsius for 60 seconds; and a second bake at an elevated temperature of about 200 degrees Celsius for 60 seconds. Compared to SiARC-like tone inversion materials, which require the following curing methods to enhance etch contrast: (i) an oxygen plasma cure, (ii) an ultraviolet cure, and/or (iii) a combination of at least two of an oxygen plasma cure, ultraviolet cure, and/or a thermal cure, the TiSi material exhibits sufficient etch resistance that no additional curing is required.

An exemplary embodiment results in a coating thickness of 25 nm, which has a characteristic of not exceeding the topmost surface of the patterned OPL 120 having a height of 30 nm, as illustrated in FIG. 2. Alternatively, a coating thickness of 45 nm may result, which has a characteristic of exceeding the topmost surface of the patterned OPL 120 having the height of 30 nm. Both of the above-mentioned embodiments result in a complete filling of the spin-on TiSi solution into the trenches of the patterned OPL 120 without voids left, as well as excellent planarization.

In some embodiments of the present invention, an etching back process with a chlorine base etch plasma is performed to remove excessive coating of the spin-on TiSi material to reveal the patterned OPL 120, with selectivity between the TiSi material, OPL, and the hard mask material layer.

The spin-on TiSi material portions 130 form a second pattern that is the complementary pattern of the OPL pattern 120 (referred to herein as a first pattern). In other words, the area in which the second pattern is present is the complement of the area in which the first pattern is present.

Figure 3:
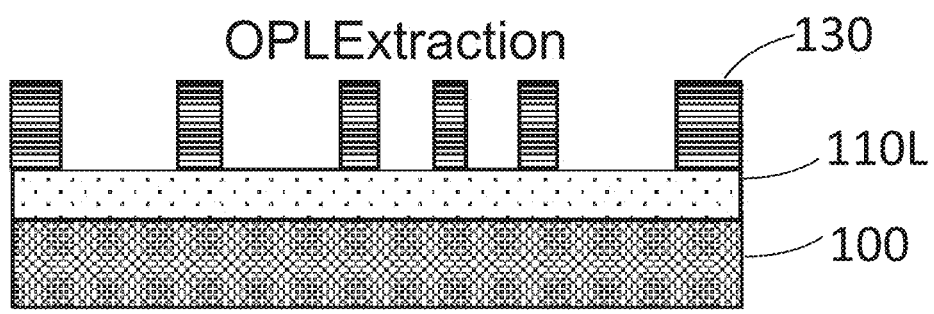
FIG. 3 illustrates an exemplary third step for patterning a hard mask material with line-space patterns below 30 nm pitch and 15 nm critical dimensions by the use of the spin-on TiSi material as a tone inversion material, according to an embodiment of the present disclosure: extracting OPL to achieve image reversal.

Referring to FIG. 3, illustrated is an exemplary third step for patterning a hard mask material with line-space patterns below a 30 nm pitch and the 15 nm critical dimension by the use of the spin-on TiSi material as tone inversion material, according to an embodiment of the present invention. In this step, extracting OPL to achieve image reversal is performed.

The patterned OPL 120 is removed selective to the spin-on TiSi material portions 130. The removal of the patterned OPL can be performed, for example, by ashing via an O$_2$ plasma chemistry. The spin-on TiSi material portions make up a set of protruding structures that are located above a planar top surface of the hard mask material layer 110L, and as such, these portions define the second pattern that is the complementary pattern of the first pattern. Thus, the aforementioned processing steps provide a tone inversion of a pattern such that the first pattern of protruding structures (e.g., the patterned OPL 120) becomes a pattern of trenches to produce the second pattern of protruding structures (e.g., the spin-on TiSi material 130) that is a complementary pattern of the first pattern, i.e., is present in the complementary area of the area of the first pattern.

Figure 4:
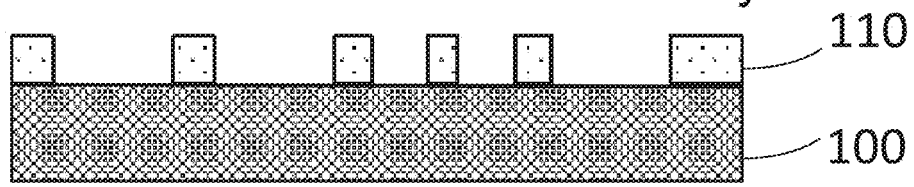
FIG. 4 illustrates an exemplary fourth step for patterning a hard mask material with line-space patterns below 30 nm pitch and 15 nm critical dimensions by the use of the spin-on TiSi material as a tone inversion material, according to an embodiment of the present disclosure: etching into the hard mask material layer.

Referring to FIG. 4, illustrated is an exemplary fourth step for patterning a hard mask material with line-space patterns below a 30 nm pitch and the 15 nm critical dimension by the use of the spin-on TiSi material as tone inversion material according to an embodiment of the present invention. In this step, etching into the hard mask material layer 110L is performed.

The second pattern present in spin-on TiSi material portions 130 are subsequently transferred into the underlying hard mask material layer 110L by employing the spin-on TiSi material portions 130 as an etch mask. The remaining portions of the hard mask material layer 110L constitute hard mask material portions 110 that replicate the second pattern. Some, all, or none, of the spin-on TiSi material portions 130 are consumed during an anisotropic etch that transfers the second pattern into the hard mask material portions 110.

In some embodiments of the present invention, the hard mask material portions 110 functions as a hard mask for subsequent anisotropic etches to be employed to further transfer the second pattern to layers located underneath the hard mask material portions 110, for instance, the auxiliary layer 100. In some embodiments of the present invention, the hard mask material portions 110 are removed during, or after, the transfer of the second pattern into layers underneath the hard mask material portions 120.

Some embodiments of the present invention may include one, or more, of the following features, characteristics and/or advantages: (i) DSA creates narrow trenches on the order of 10 to 17 nm wide that are difficult to fill; (ii) the present invention is not limited to grapho-epitaxy, but also applied to chemical epitaxy; (iii) the spin-on TiSi material in the present invention has twice the etch selectivity compared to a conventional SiARC-like material; (iv) the spin-on TiSi material has a low molecular weight and is soluble in organic solvents; (v) the tone inverted pattern can be transferred into underlying layers with better etch resistance by employing the spin-on TiSi material without additional annealing processes; and/or (vi) an improved etch budget and/or process window employs the spin-on TiSi material as a tone inversion material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A process for patterning a hard mask material with line-space patterns below a 30 nm pitch and a 15 nm critical dimension by employing a spin-on titanium silicon (TiSi) material as a tone inversion material, comprising:
   patterning an organic planarization (OPL) layer over a hard mask material with a line-space pattern below the 30 nm pitch and the 15 nm critical dimension;
   formulating, filling, and overcoating the spin-on TiSi material into a patterned OPL layer;
   etching back an excessive spin-on TiSi material, the excessive spin-on TiSi material overcoating the patterned OPL layer;
   extracting the patterned OPL layer to achieve an inverted pattern; and
   etching the inverted pattern into the hard mask material; wherein:
   the step of formulating, filling, and overcoating the spin-on TiSi material into the patterned OPL layer includes: (i) a first bake at an elevated temperature of 150 degrees Celsius for 60 seconds; and (ii) a second bake at an elevated temperature of 200 degrees Celsius for 60 seconds.

2. The process of claim 1, wherein the patterned OPL layer has an OPL pattern that is transferred from a first pattern generated by a directed self assembly (DSA) process that is performed using one of a chemical epitaxy and a graphoepitaxy.

3. The process of claim 2, wherein the OPL pattern is transferred from the first pattern by employing an $O_2$-based plasma etching process selective to the spin-on TiSi material.

4. The process of claim 1, wherein the filling and overcoating of the spin-on TiSi material into the patterned OPL layer is performed by a spin-coating process.

5. The process of claim 1, wherein:
   the spin-on TiSi material includes a silicon-containing recurring unit and a titanium-containing recurring unit; and
   the spin-on TiSi material has a molecular weight in a range from 500 to 1500.

6. The process of claim 1, wherein the hard mask material includes at least one of silicon nitride, silicon oxide, and silicon oxynitride.

7. The process of claim 1, wherein the inverted pattern is complementary to the OPL pattern.

8. The process of claim 1, wherein the inverted pattern is etched into the hard mask material using the inverted pattern as a mask by employing an etch process selective to the spin-on TiSi material.

9. The process of claim 8, wherein the etch process includes at least a chlorine-based plasma etch process.

10. The process of claim 1, wherein the spin-on TiSi material is a polymer or an oligomer having a polydispersity of less than 1.5.

11. The process of claim 10, wherein the spin-on TiSi material is soluble in casting solvents having a close cup flash point greater than 35 degrees Celsius.

12. The process of claim 11, wherein the solvents include: cyclohexanone and propylene glycol monomethyl ether acetate.

13. The process of claim 10, wherein the spin-on TiSi material has twice the etch selectivity compared to a SiARC-like material.

14. The process of claim 1, wherein the spin-on TiSi material is a spin-on TiSi oligomer.

15. The process of claim 1, wherein a ratio of the numbers of repeat units of the silicon-containing unit with respect to the numbers of repeat units of the titanium-containing unit is in a range from 40:60 to 60:40.

* * * * *